United States Patent
Hau-Riege et al.

(10) Patent No.: US 6,762,597 B1
(45) Date of Patent: Jul. 13, 2004

(54) STRUCTURE, SYSTEM, AND METHOD FOR ASSESSING ELECTROMIGRATION PERMEABILITY OF LAYER MATERIAL WITHIN INTERCONNECT

(75) Inventors: Christine Hau-Riege, Fremont, CA (US); Stefan Hau-Riege, Fremont, CA (US); Amit P. Marathe, Fremont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/283,625

(22) Filed: Oct. 30, 2002

(51) Int. Cl.[7] .......................... G01R 31/26; H01L 23/58
(52) U.S. Cl. ........................................ 324/71.1; 257/48
(58) Field of Search ........................... 324/71.1, 71.5, 324/765, 537; 438/17–18; 257/48, 758

(56) References Cited

U.S. PATENT DOCUMENTS

| | | | | |
|---|---|---|---|---|
| 5,712,510 A | * | 1/1998 | Bui et al. | 257/758 |
| 5,900,735 A | * | 5/1999 | Yamamoto | 324/537 |

OTHER PUBLICATIONS

I.A. Blech and Conyers Herring, *Stress Generation by Electromigration*, Applied Physics Letters, vol. 29, NO. 3, Aug. 1976, pp. 131–133.

K. Ueno et al., *A High Reliability Copper Dual–Damascene Interconnection with Direct–Contact Via Structure*, IEDM, 2000, 265–268.

S.P. Riege et al., *A Hierarchical Reliability Analysis for Circuit Design Evaluation*, IEEE Transactions on Electron Devices, vol. 45, No. 10, Oct. 1998, pp. 2254–2257.

Young Joon Park and Carl V. Thompson, *The Effects of the Stress Dependence of Atomic Diffusivity on Stress Evolution due to Electromigration*, J. Appl. Phys., vol. 82, No. 9, Nov. 1997, pp. 4277–4281.

C.S. Hau–Riege and Carl V. Thompson, *The Effects of Microstructural Transitions at Width Transitions on Interconnect Reliability*, J. Appl. Phys., vol. 82, No. 12, Jun. 12, 2000, pp. 8467–8472.

* cited by examiner

Primary Examiner—Evan Pert
(74) Attorney, Agent, or Firm—Monica H. Choi

(57) ABSTRACT

For determining electromigration permeability of a layer material, a test line, a feeder line, and a cathode line of an interconnect test structure are formed with current flowing from the test line through the feeder line to the cathode line. A no-flux structure is disposed between the cathode line and the feeder line, and the layer material is disposed between the feeder line and the test line. A respective current density and length product of the feeder line and the test line is respectively less than and greater than a respective critical Blech length constant. An occurrence of a void within the feeder line or the test line indicates that the layer material is permeable or impermeable.

26 Claims, 12 Drawing Sheets

STRUCTURE, SYSTEM, AND METHOD FOR ASSESSING ELECTROMIGRATION PERMEABILITY OF LAYER MATERIAL WITHIN INTERCONNECT

TECHNICAL FIELD

The present invention relates generally to interconnect technology in integrated circuit fabrication, and more particularly, to an interconnect structure, a system, and a method for assessing the permeability of layer material within interconnect such as a diffusion barrier layer material at a via bottom for example.

BACKGROUND OF THE INVENTION

Common components of a monolithic IC (integrated circuit) include interconnect structures such as metal lines for electrically connecting integrated circuit devices formed on a semiconductor substrate, as known to one of ordinary skill in the art of integrated circuit fabrication. A long-recognized important objective in the constant advancement of monolithic IC (Integrated Circuit) technology is the scaling-down of IC dimensions. Such scaling-down of IC dimensions reduces area capacitance and is critical to obtaining higher speed performance of integrated circuits. Moreover, reducing the area of an IC die leads to higher yield in IC fabrication. Such advantages are a driving force to constantly scale down IC dimensions.

Thus far, aluminum has been prevalently used for metallization within integrated circuits. However, as the width of metal lines are scaled down to smaller submicron and even nanometer dimensions, aluminum metallization is more prone to electromigration failure. Electromigration failure, which may lead to open and extruded metal lines, is now a commonly recognized problem. Moreover, as dimensions of metal lines further decrease, metal line resistance increases substantially, and this increase in line resistance may adversely affect circuit performance.

Given the concerns of electromigration and line resistance with smaller metal lines and vias, copper is considered a more viable metal for smaller metallization dimensions. Copper has lower bulk resistivity and potentially higher electromigration tolerance than aluminum. Both the lower bulk resistivity and the higher electromigration tolerance improve circuit performance.

Unfortunately, copper is a mid-bandgap impurity in silicon, silicon dioxide, and other dielectric materials. Thus, copper may diffuse easily into these common integrated circuit materials to degrade the circuit performance of integrated circuits. To prevent such undesired diffusion of copper, a diffusion barrier layer material is deposited to surround the copper interconnect at the interface between the copper interconnect and the surrounding material, as known to one of ordinary skill in the art of integrated circuit fabrication.

As device dimensions including dimensions of the copper interconnect are further scaled down, the thickness of the diffusion barrier layer material surrounding the interconnect is minimized to in turn minimize the resistance of the interconnect. However, with such thinner diffusion barrier layer material surrounding the interconnect, the material of the interconnect may undesirably move through the thin diffusion barrier layer material due to electron wind force. Such flux divergence is especially prevalent with higher current density through the interconnect as dimensions of the interconnect are further scaled down.

Such an attribute of the diffusion barrier layer material surrounding an interconnect wherein material of the interconnect moves through the diffusion barrier layer material due to electron wind force is termed the "permeability" of the diffusion barrier layer material that is said to be "permeable". The flux of material of the interconnect through the diffusion barrier layer material may lead to interconnect failure from formation of voids within the interconnect. Thus, the permeability of the diffusion barrier layer material is desired to be characterized.

FIG. 1 shows an interconnect test structure 100 of the prior art for characterizing electromigration failure of a test line 102. The test line 102 is comprised of copper for example, and in that case, the test line 102 is surrounded by a diffusion barrier layer material 104. The test line 102 is coupled to a first feeder line 106 by a first via 108, and the test line 102 is coupled to a second feeder line 110 by a second via 112. The first via 108 and the second via 112 are part of the dual damascene structure of the test line 102, and the diffusion barrier layer material 104 surrounds the first via 108 and the second via 112.

The first and second feeder lines 106 and 110 are comprised of copper for example, and in that case, the first and second feeder lines 106 and 110 are surrounded by diffusion barrier layer materials 114 and 116, respectively. The first feeder line 106 is coupled to a first test pad 118, and the second feeder line 110 is coupled to a second test pad 120. During characterization of the interconnect test structure 100 of the prior art, electrons flow from the first feeder line 106 through the test line 102 to the second feeder line 110 when current is applied to flow through the interconnect test structure 100 via the first and second test pads 118 and 120.

In the interconnect test structure 100 of the prior art, the width of the feeder lines 106 and 110 (i.e., the dimension of the lines 106 and 110 going into the drawing page of FIG. 1) is significantly larger (i.e., more than ten times larger for example) than the width of the test line 102 (i.e., the dimension of the test line 102 going into the drawing page of FIG. 1). Thus, even when the diffusion barrier layer material 104 at the interface of interest 122 between the first via 108 and the first feeder line 106 is significantly permeable, the effect of the flux of material of the first feeder line 106 through such diffusion barrier layer material 104 into the test line 102 is not noticeable because the volume of such flux of material of the first feeder line 106 through the diffusion barrier layer material 104 into the test line 102 is negligible compared to the total volume of the first feeder line 106.

However, the permeability of the diffusion barrier layer material is desired to be characterized because flux of material of the interconnect through the diffusion barrier layer material may lead to interconnect failure from formation of voids within the interconnect. Thus, a mechanism is desired for assessing the permeability of the diffusion barrier layer material within interconnect.

SUMMARY OF THE INVENTION

Accordingly, in a general aspect of the present invention, a novel interconnect test structure is formed to assess the permeability of layer material within interconnect.

In one embodiment of the present invention, an interconnect test structure for assessing electromigration permeability of a layer material within an interconnect includes a feeder line comprised of a conductive material and having a first current density, $J_1$, and a first length, $L_1$. In addition, the interconnect test structure includes a cathode line comprised of a conductive material and coupled to the feeder line, and the cathode line is a source of electrons flowing into the feeder line. Furthermore, the interconnect test structure includes a test line comprised of a conductive material and coupled to the feeder line and having a second current density, $L_2$, and a second length, $L_2$, and the test line is a sink of electrons flowing from the feeder line. Additionally, the interconnect test structure includes a no-flux structure disposed between the cathode line and the feeder line. The layer material is disposed between the feeder line and the test line.

A product of the first current density and the first length of the feeder line, $J_1*L_1$, is less than a critical Blech length constant, $(J*L)_{CRIT1}$ for the feeder line. In addition, a product of the second current density and the second length of the test line, $J_2*L_2$, is greater than a critical Blech length constant, $(J*L)_{CRIT2}$ for the test line. An occurrence of a void within the feeder line indicates that the layer material is permeable, and an occurrence of a void within the test line indicates that the layer material is impermeable.

In another embodiment of the present invention, the layer material is disposed at a bottom of a via disposed between the feeder line and the test line that are fabricated as two separate interconnect levels, and the via is part of a dual damascene structure for the test line. In that case, an occurrence of a void within the via indicates that the layer material is impermeable. Alternatively, the layer material is disposed at a bottom of a via disposed between the feeder line and the test line that are fabricated as two separate interconnect levels, and the via is part of a dual damascene structure for the feeder line.

In a further embodiment of the present invention, a plurality of such interconnect test structures are formed, with each interconnect test structure having a respective feeder line with a respective width such that the widths of the respective feeder lines of the plurality of the interconnect test structure successively increases. A critical width of the respective feeder line of one of the plurality of the interconnect test structures is determined when a respective void therein transitions from occurring within the feeder line to occurring within the test line. This critical width indicates a level of permeability of the layer material.

In this manner, the interconnect test structure of the present invention determines whether or not the layer material within the interconnect is permeable. In addition, the level of permeability of the layer material is also determined. Such an interconnect test structure may advantageously be used for assessing the permeability of a diffusion barrier material within interconnect. The permeability of a diffusion barrier layer material within an interconnect results in electromigration failure of the interconnect structure, especially as the barrier material becomes thinner as integrated circuit device dimensions are further scaled down. The interconnect test structure of the present invention may advantageously be used for characterizing the level of such permeability for various thicknesses of the barrier layer material and for various types of the barrier layer material to design for minimized electromigration failure of interconnect structures having a diffusion barrier layer material.

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1, 2, 3, 4, 5, 6, 7, 8, 9, 10, 11, 12, and 13 refer to elements having similar structure and function.

DETAILED DESCRIPTION

Figure 2:
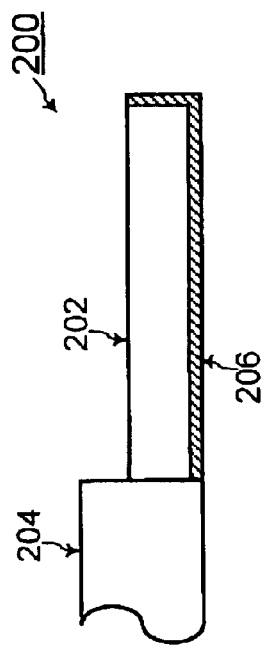
FIG. 2 shows a cross-sectional view of a cathode line formed for an interconnect test structure, according to an embodiment of the present invention.
Figure 3:
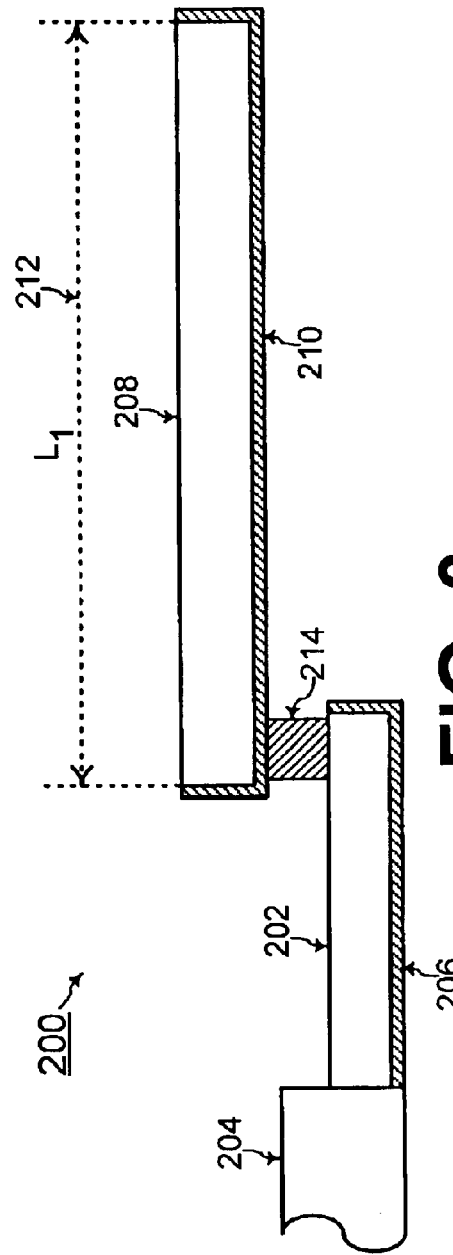
FIG. 3 shows a cross-sectional view of a no-flux via and a feeder line formed to be coupled to the cathode line of FIG. 10 for the interconnect test structure, according to an embodiment of the present invention.
Figure 4:
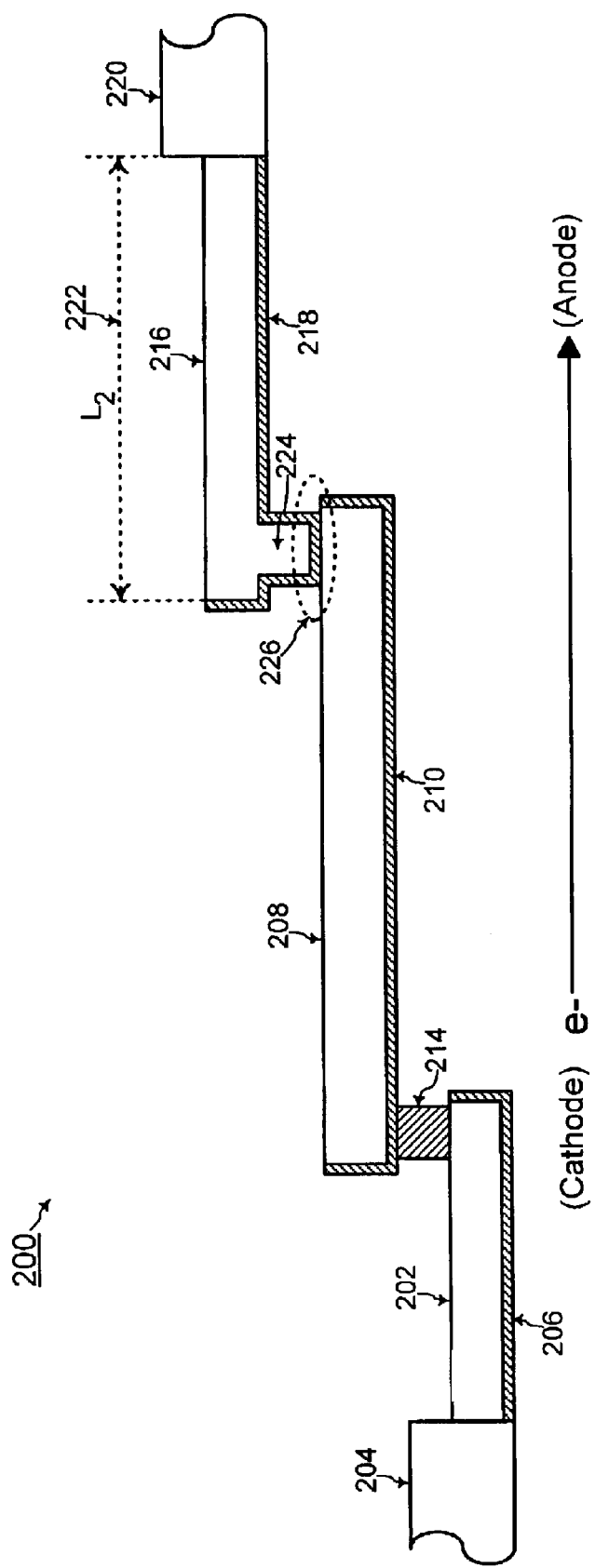
FIG. 4 shows a cross-sectional view of a test line with a diffusion barrier layer material interface to the feeder line of FIG. 3 for the interconnect test structure, according to an embodiment of the present invention.

FIGS. 2, 3, and 4 are cross-sectional views illustrating formation of an interconnect test structure 200 for assessing electromigration permeability of a layer material within the interconnect test structure 200 of an embodiment of the present invention. Referring to FIG. 2, the interconnect test structure 200 includes a cathode line 202 coupled to a first test pad 204. In an example embodiment, the cathode line 202 is comprised of copper and is surrounded by a diffusion barrier layer material 206. The diffusion barrier layer material 206 prevents diffusion of copper of the cathode line 202 into surrounding insulator or semiconductor material, and such diffusion barrier layer materials are known to one of ordinary skill in the art of integrate circuit fabrication.

Referring to FIG. 3, the interconnect test structure 200 is further formed to include a feeder line 208 on another interconnect level from the interconnect level of the cathode line 202. In an example embodiment, the feeder line 208 is comprised of copper and is surrounded by a diffusion barrier layer material 210. The diffusion barrier layer material 210 prevents diffusion of copper of the feeder line 208 into surrounding insulator or semiconductor material, and such diffusion barrier layer materials are known to one of ordinary skill in the art of integrate circuit fabrication. In addition, the feeder line 208 is formed to have a first length, $L_1$, 212. The "length" of an interconnect line is generally defined herein as the length portion of the interconnect line through which current is conducted during assessment of the electromigration failure of the interconnect structure having that interconnect line.

The feeder line 208 and the cathode line 202 are formed as two separate interconnect levels. For example in FIG. 3, the feeder line 208 is formed in an upper interconnect level, and the cathode line 202 is formed in a lower interconnect level. Processes for forming interconnect lines within separate interconnect levels are known to one of ordinary skill in the art of integrated circuit fabrication. In an aspect of the present invention, a no-flux structure 214 is formed between the cathode line 202 and the feeder line 208 for coupling the feeder line 208 to the cathode line 202. In one embodiment of the present invention, the no-flux structure 214 is a via comprised of tungsten.

Referring to FIG. 4, the interconnect test structure 200 is further formed to include a test line 216 on another interconnect level from the interconnect level of the feeder line 208. In an example embodiment, the test line 216 is comprised of copper and is surrounded by a diffusion barrier layer material 218. The diffusion barrier layer material 218 prevents diffusion of copper of the test line 216 into surrounding insulator or semiconductor material, and such diffusion barrier layer materials are known to one of ordinary skill in the art of integrate circuit fabrication. The test line 216 is coupled to a second test pad 220. In addition, the test line 216 is formed to have a second length, $L_2$, 222.

The feeder line 208 and the test line 216 are formed as two separate interconnect levels. For example in FIG. 4, the feeder line 208 is formed in the lower interconnect level, and the test line 216 is formed in the upper interconnect level. Processes for forming interconnect lines within separate interconnect levels are known to one of ordinary skill in the art of integrated circuit fabrication. A via structure 224 is formed as part of a dual damascene structure of the test line 216 in one embodiment of the present invention for coupling the test line 216 to the feeder line 208. The diffusion barrier layer material 218 formed at the bottom of the via structure 224 is at the interface 226 of interest between the test line 216 and the feeder line 208. The interconnect test structure 200 is used for assessing the electromigration permeability of that portion of the diffusion barrier layer material 218 formed at the bottom of the via structure 224 and at the interface 226 between the test line 216 and the feeder line 208.

Figure 5:
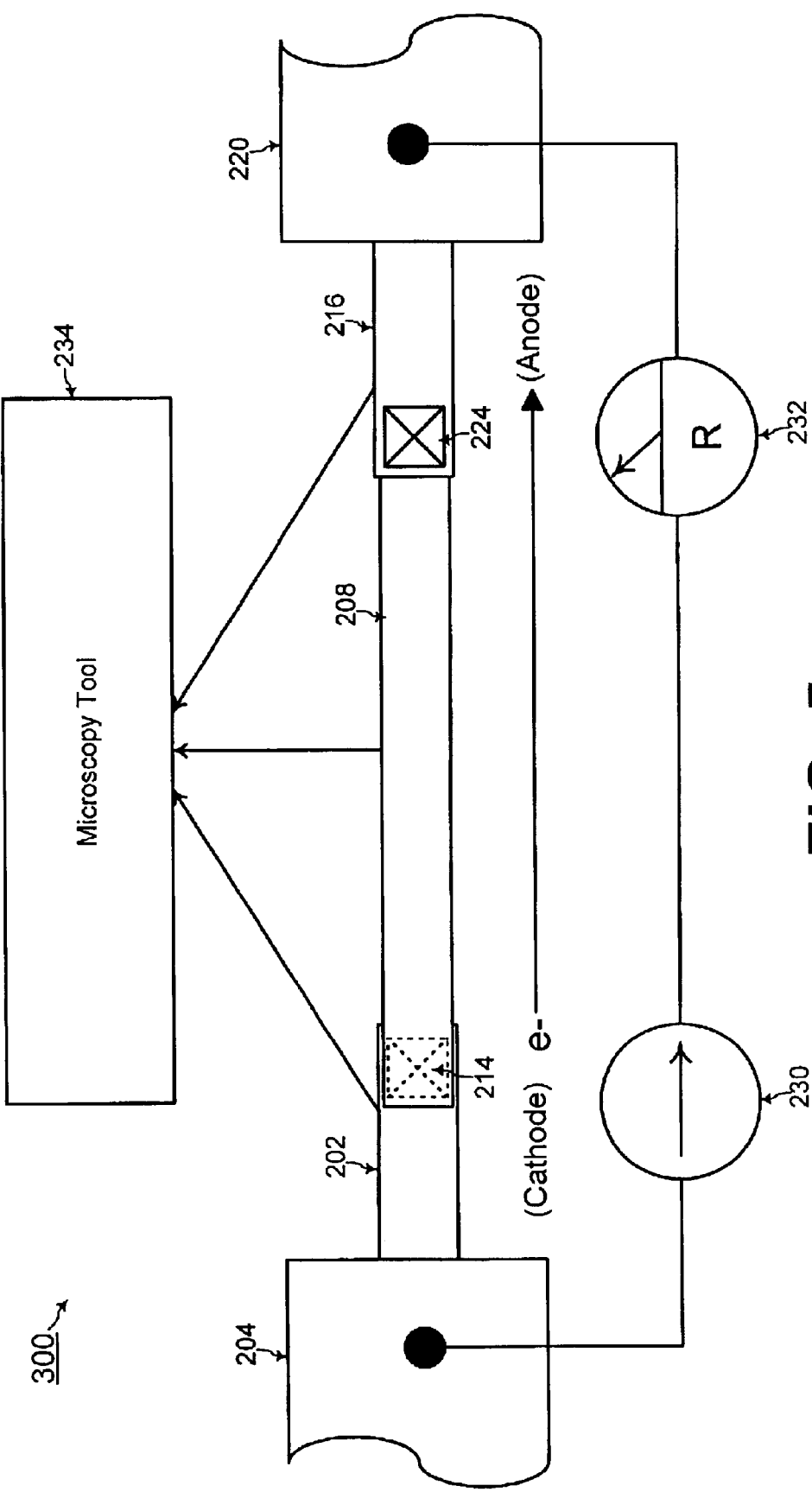
FIG. 5 shows a top view of the interconnect test structure of FIG. 4 with components of a system for assessing electromigration permeability of the diffusion barrier layer material between the feeder line and the test line within the interconnect test structure of FIG. 4, according to an embodiment of the present invention.

Referring to FIG. 5, a system for assessing the electromigration permeability of that portion of the diffusion barrier layer material 218 formed at the bottom of the via structure 224, includes a current source 230 for conducting current through the test line 216, the feeder line 208, and the cathode line 202. FIG. 5 shows a top view of the test line 216, the feeder line 208, the cathode line 202, and the first and second test pads 204 and 220 of the interconnect test structure 200.

The current source 230 is coupled between the first and second test pads 204 and 220 and provides the current flowing through the test line 216, the feeder line 208, and the cathode line 202. The cathode line 202 is at the cathode end and acts as a source of electrons flowing into the feeder line 208. The test line 216 is at the anode end and acts as a sink of electrons flowing out of the feeder line 208. Such a current source 230 is individually known to one of ordinary skill in the art of electronics.

Referring to FIGS. 4 and 5, the level of current from the current source 230 determines a first current density $J_1$ through the feeder line 208 and a second current density $J_2$ through the test line 216. The first current density $J_1$ through the feeder line 208 is determined by the level of current from the current source 230 and the area of the feeder line 208 (i.e., the cross-sectional area of the feeder line 208 going into the drawing page of FIG. 4), as known to one of ordinary skill in the art of integrated circuit fabrication. The second current density $J_2$ through the test line 216 is determined by the level of current from the current source 230 and the area of the test line 216 (i.e., the cross-sectional area of the test line 216 going into the drawing page of FIG. 4), as known to one of ordinary skill in the art of integrated circuit fabrication.

In addition, the system 300 includes a resistance meter 232 coupled between the first and second test pads 204 and 220 for determining when the interconnect test structure 200 exhibits electromigration failure. The resistance meter 232 measures the resistance of the interconnect test structure 200 (i.e., the resistance across the test line 216, the feeder line 208, and the cathode line 202) as current from the current source 230 flows through the test line 216, the feeder line 208, and the cathode line 202. When such a resistance exceeds a predetermined threshold, the interconnect test structure 200 is determined to exhibit electromigration failure. When current flows through the test line 216, the feeder line 208, and the cathode line 202, flux divergence of material causes a void within one of the test line 216, the feeder line 208, and the cathode line 202 to result in the electromigration failure.

When the interconnect test structure 200 is determined to exhibit electromigration failure, a cross-section along the length of the interconnect test structure 200 (such as the cross-sectional view of FIG. 4 for example) is viewed with a microscopy tool 234 to determine a location of a void that causes such electromigration failure for assessing the electromigration permeability of the diffusion barrier layer material 218 at the bottom of the via structure 224 in FIG. 4.

Mechanisms for making such a cross-section along the length of the interconnect test structure 200 and such a microscopy tool (for example the SEM (scanning electron microscope)) are individually known to one of ordinary skill in the art of integrated circuit fabrication.

Referring to FIGS. 3, 4, and 5, the first length $L_1$ and the first current density $J_1$ of the feeder line 208 are designed such that the product of such values $(J_1*L_1)$ is less than a critical Blech length constant $(J*L)_{CRIT}$ corresponding to the feeder line 208, according to an aspect of the present invention. The critical Blech length constant $(J*L)_{CRIT}$ is a constant for an interconnect line depending on various processing parameters for the interconnect line such as the material comprising the interconnect line and the material surrounding the interconnect line for example, as known to one of ordinary skill in the art of integrated circuit fabrication.

When the current density, J, and the length, L, for an interconnect line is designed such that the product of such values $(J*L)$ is less than the critical Blech length constant $(J*L)_{CRIT}$, then that interconnect line is immortal and does not exhibit electromigration failure, as known to one of ordinary skill in the art of integrated circuit fabrication. On the other hand, the second length $L_2$ and the second current density $J_2$ of the test line 216 are designed such that the product of such values $(J_2*L_2)$ is greater than the critical Blech length constant $(J*L)_{CRIT}$ corresponding to the test line 216, according to an aspect of the present invention.

Figure 6:
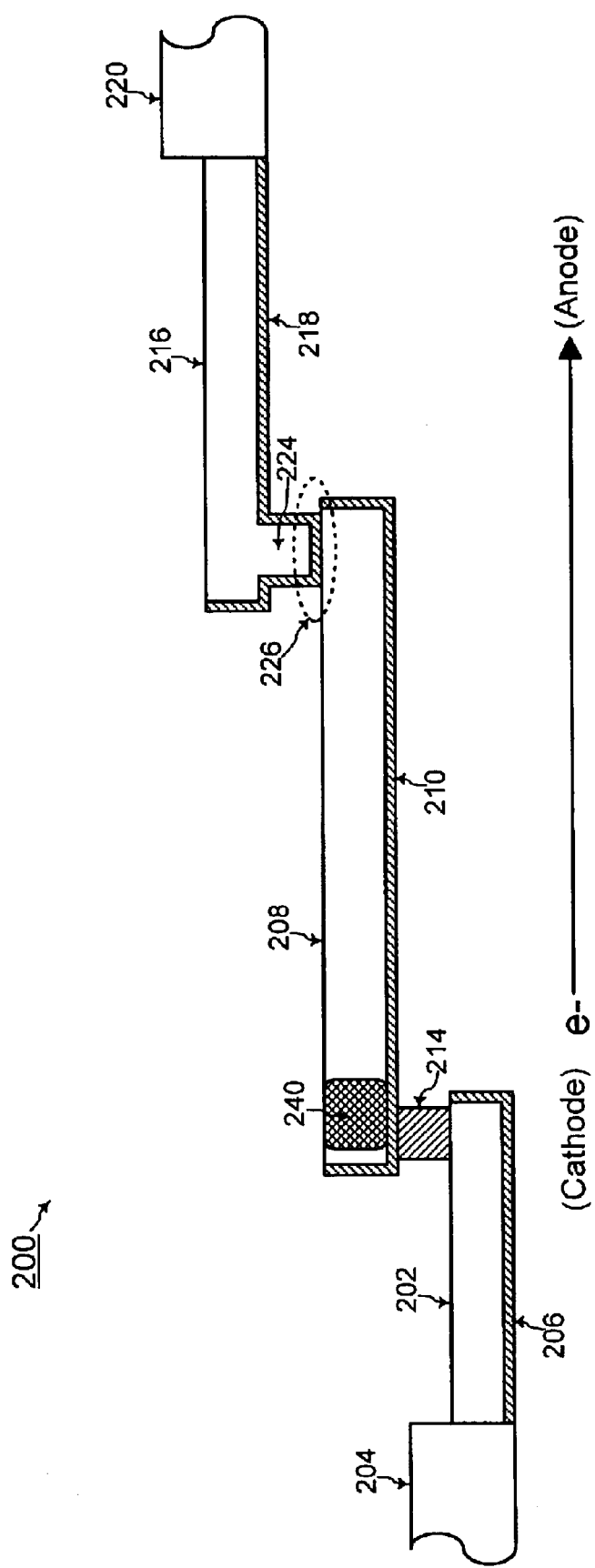
FIG. 6 shows the cross-sectional view of the interconnect test structure of FIG. 4 with formation of a void within the feeder line when the diffusion barrier layer material between the feeder line and the test line is permeable, according to an embodiment of the present invention.

FIG. 6 illustrates the cross-sectional view of the interconnect test structure 200 that exhibits electromigration failure from formation of a void 240 toward the cathode end of the feeder line 208. Such a location of the void 240 in FIG. 6 indicates that the diffusion barrier layer material 218 at the bottom of the via structure 224 is permeable. Because the first length $L_1$ and the first current density $J_1$ of the feeder line 208 are designed such that the product of such values $(J_1*L_1)$ is less than a critical Blech length constant $(J*L)_{CRIT}$ corresponding to the feeder line 208, the formation of the void 240 within the feeder line 208 is attributable to flux of material of the feeder line 208 through the permeable diffusion barrier layer material 218 at the bottom of the via structure 224. Because material of the feeder line 208 moves through the permeable diffusion barrier layer material 218 while the no-flux via structure 214 prevents movement of material from the cathode line 202 into the feeder line 208, a net negative flux of material out of the feeder line 208 causes formation of a void 240 within the feeder line 208.

Figure 7:
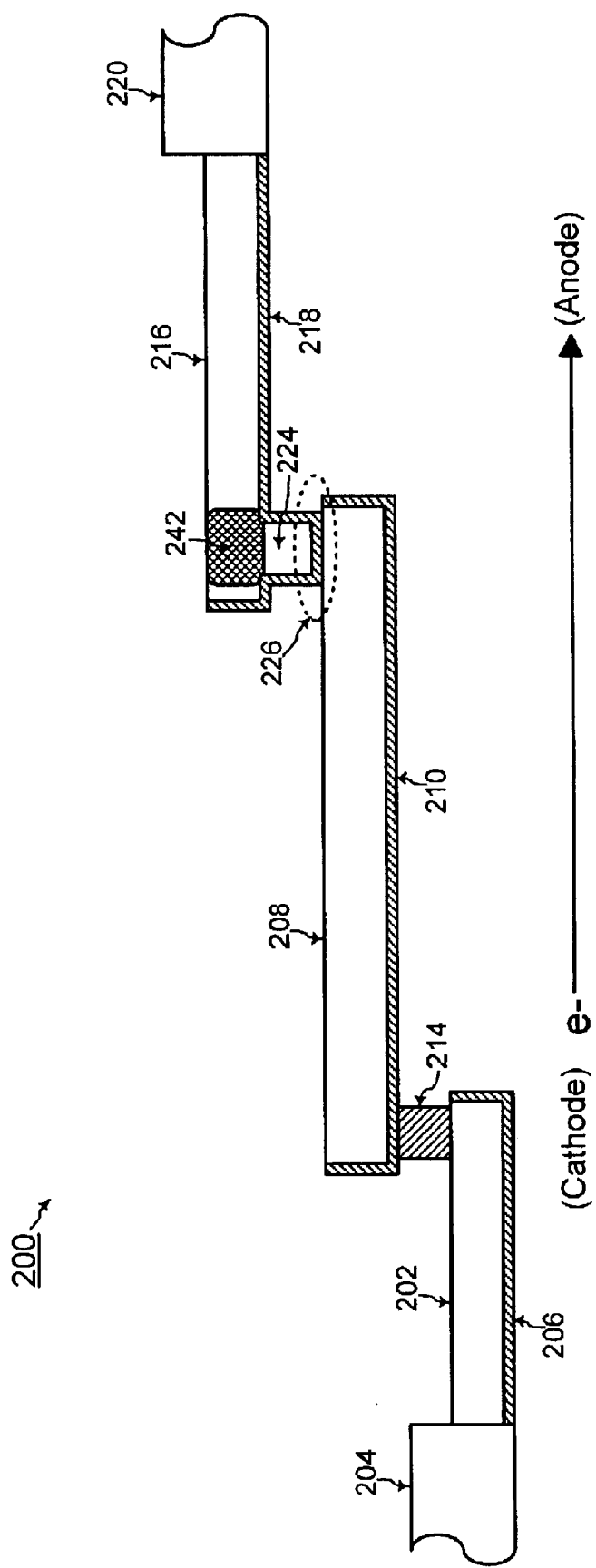
FIG. 7 shows the cross-sectional view of the interconnect test structure of FIG. 4 with formation of a void within the test line when the diffusion barrier layer material between the feeder line and the test line is impermeable, according to an embodiment of the present invention.

In contrast, FIG. 7 illustrates the cross-sectional view of the interconnect test structure 200 that exhibits electromigration failure from formation of a void 242 toward the cathode end of the test line 216. Such a location of the void 242 in FIG. 7 indicates that the diffusion barrier layer material 218 at the bottom of the via structure 224 is impermeable. The first length $L_1$ and the first current density $J_1$ of the feeder line 208 are designed such that the product of such values $(J_1*L_1)$ is less than a critical Blech length constant $(J*L)_{CRIT}$ corresponding to the feeder line 208. In addition, when the bottom of the via structure 224 is impermeable, there is net zero flux of material from or into the feeder line 208. Because of such structural conditions of the feeder line 208, no void is formed within the feeder line 208 when the diffusion barrier layer material 218 at the bottom of the via structure 224 is impermeable.

Figure 8:
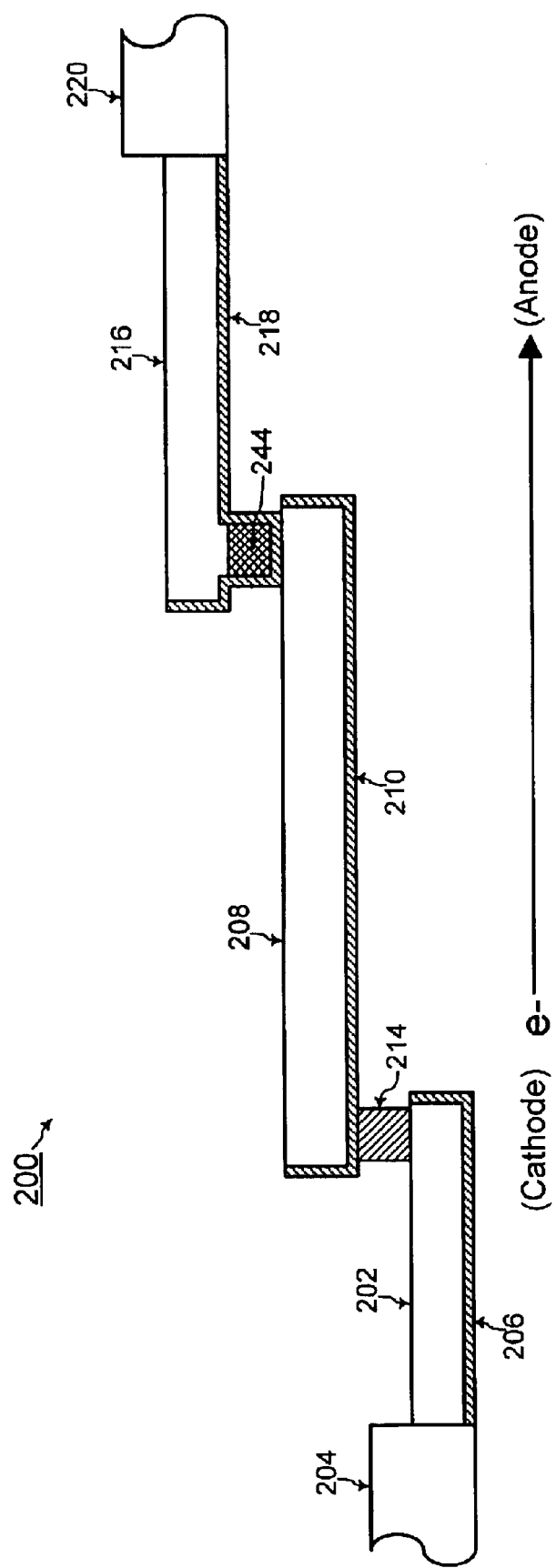
FIG. 8 shows the cross-sectional view of the interconnect test structure of FIG. 4 with formation of a void within a via coupling the feeder line and the test line when the diffusion barrier layer material at the bottom of the via is impermeable, according to an embodiment of the present invention.

However, because the second length $L_2$ and the second current density $J_2$ of the test line 216 are designed such that the product of such values $(J_2*L_2)$ is greater than the critical Blech length constant $(J*L)_{CRIT}$ corresponding to the test line 216, the interconnect test structure 200 exhibits electromigration failure from formation of a void 242 within the test line 216 when the diffusion barrier layer material 218 at the bottom of the via structure 224 is impermeable. Alternatively, referring to FIG. 8, the interconnect test structure 200 may also exhibit electromigration failure from formation of a void 244 within the via structure 224 when the diffusion barrier layer material 218 at the bottom of the via structure 224 is impermeable. In either case, formation of a void either within the test line 216 or the via structure 224 indicates that the diffusion barrier layer material 218 at the bottom of the via structure 224 is impermeable.

In this manner, the system 300 of FIG. 5 is used to assess whether the diffusion barrier layer material 218 at the bottom of the via structure 224 is permeable or impermeable. A current from the current source 230 is conducted through the test line 216, the feeder line 208, and the cathode line 202 of the interconnect test structure 200 until electromigration failure is detected by the resistance meter 232. Then a cross-section along the length of the interconnect test structure 200 is viewed with the microscopy tool 234 to determine the location of the void within the interconnect test structure 200 causing the electromigration failure. The location of the void within the interconnect test structure 200 indicates whether the diffusion barrier layer material 218 at the bottom of the via structure 224 is permeable or impermeable.

Figure 9:
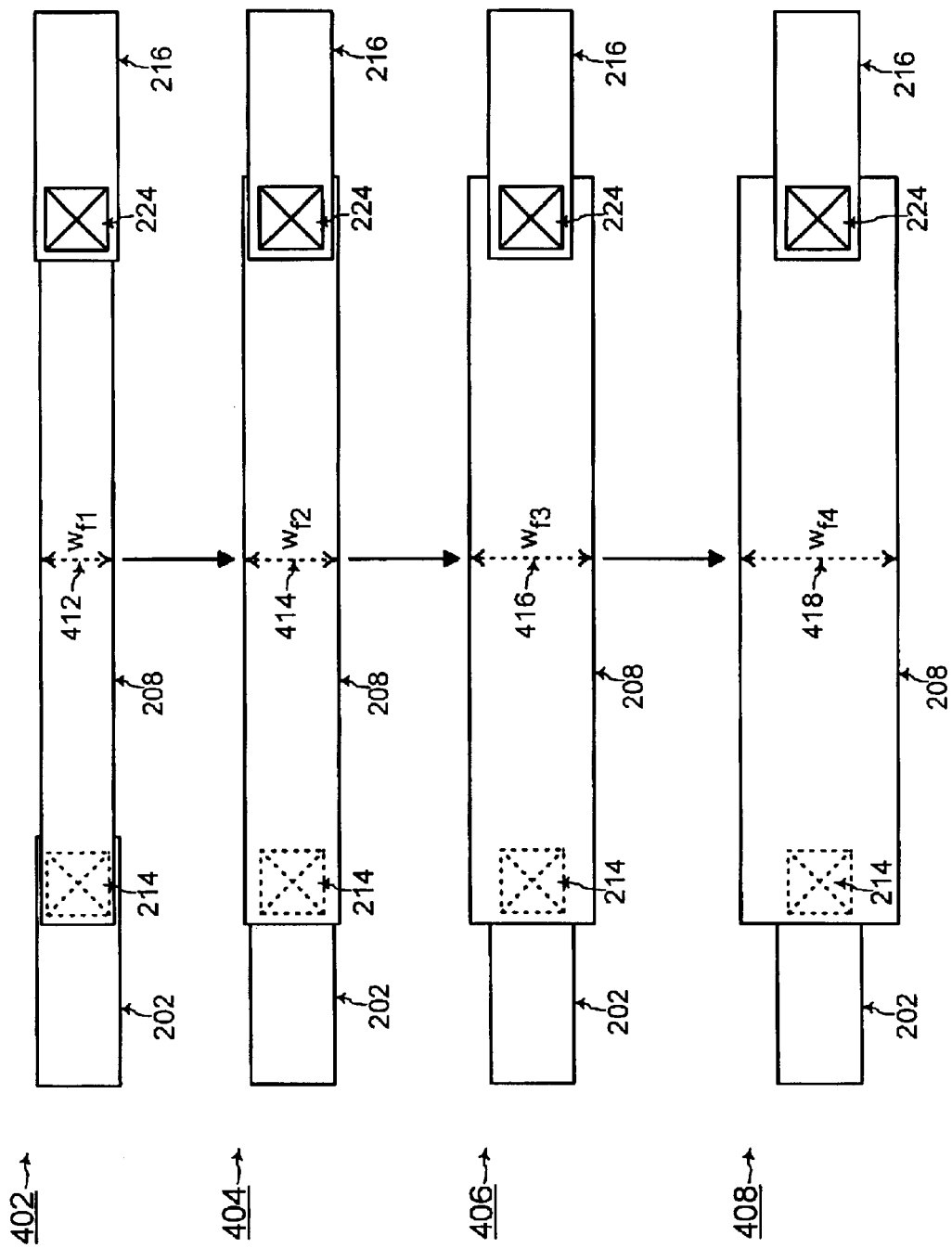
FIG. 9 shows a top via of a plurality of the interconnect test structure of FIG. 4 with each interconnect test structure having a respective feeder line with a respective width such that the widths of the respective feeder lines of the plurality of the interconnect test structure successively increases for determining a level of permeability of the diffusion barrier layer material, according to an embodiment of the present invention.

Referring to FIGS. 6 and 9, once the diffusion barrier layer material 218 at the bottom of the via structure 224 is determined to be permeable, a plurality of the interconnect test structure 200 of FIG. 4 is formed to quantify a level of permeability of the diffusion barrier layer material 218. FIG. 9, for example, illustrates a top view of such a plurality of interconnect test structures including a first interconnect test structure 402, a second interconnect test structure 404, a third interconnect test structure 406, and a fourth interconnect test structure 408. Each of the first, second, third, and fourth interconnect test structures, 402, 404, 406, and 408, respectively, has a respective cathode line 202, a respective no-flux structure 214, a respective feeder line 208, a respective test line 216, and a respective via 224, formed as illustrated in the cross-sectional view of FIG. 4.

However, referring to FIG. 9, the respective width of the respective feeder line 208 for each of the first, second, third, and fourth interconnect test structures 402, 404, 406, and 408 successively increases. For example, the first interconnect test structure 402 has a respective feeder line 208 with a first width, $w_{f1}$. Then, the second interconnect test structure 404 has a respective feeder line 208 with a second width, $w_{f2}$, that is greater than the first width, $w_{f1}$, of the respective feeder line of the first interconnect test structure 402. Similarly, the third interconnect test structure 406 has a respective feeder line 208 with a third width, $w_{f3}$, that is greater than the second width, $w_{f2}$, of the respective feeder line of the second interconnect test structure 404. Finally, the fourth interconnect test structure 408 has a respective feeder line 208 with a fourth width, $w_{f4}$, that is greater than the third width, $w_{f3}$, of the respective feeder line of the third interconnect test structure 406.

Figure 10:
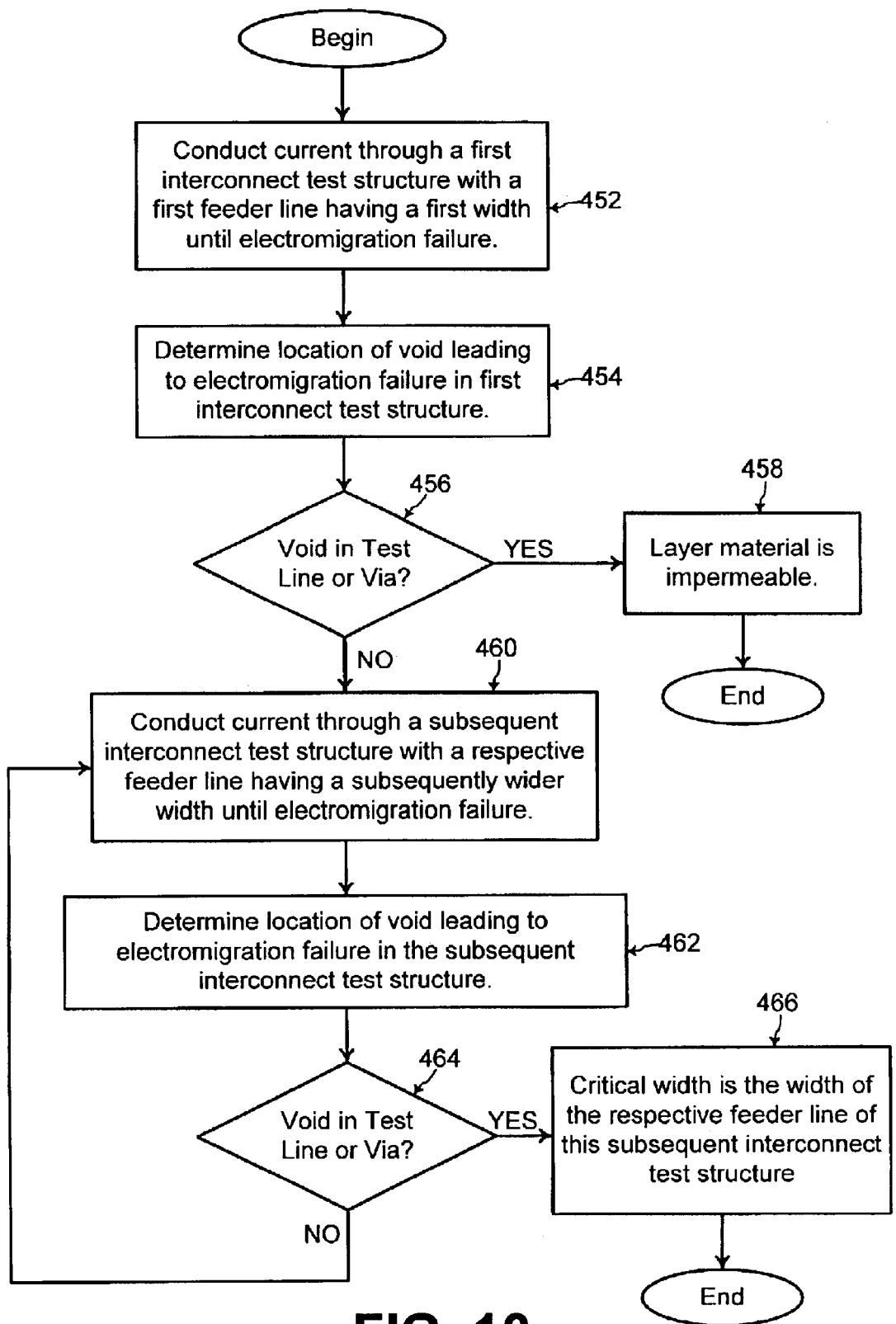
FIG. 10 shows a flow-chart of steps for using the plurality of interconnect test structures of FIG. 9 for determining a level of permeability of the diffusion barrier layer material, according to an embodiment of the present invention.

FIG. 10 shows a flow-chart of steps for using the plurality of interconnect test structures 402, 404, 406, and 408 of FIG. 9 for assessing the level of permeability of the diffusion barrier layer material 218 at the bottom of the via structure 224. Referring to FIGS. 5, 9 and 10, current from the current source 230 is conducted through the first interconnect test structure 402 until the first interconnect test structure 402 exhibits electromigration failure (step 452 of FIG. 10). The location of the void causing the electromigration failure within the first interconnect test structure 402 is then determined (step 454 of FIG. 10). If the location of such a void is within the respective test line 216 or the respective via 224 of the first interconnect test structure 402 (step 456 of FIG. 10), then the diffusion barrier layer material 218 at the bottom of the via structure 224 is determined to be impermeable (step 458 of FIG. 10), and the assessment procedure ends.

On the other hand, if the location of such a void is within the respective feeder line 208 of the first interconnect test structure 402 instead of within respective test line 216 or the respective via 224, then the diffusion barrier layer material 218 at the bottom of the via structure 224 is determined to be permeable, and the assessment procedure of FIG. 10 continues onto step 460 for quantifying the level of such permeability of the diffusion barrier layer material 218.

Referring to FIGS. 9 and 10, when the diffusion barrier layer material 218 is determined to be permeable by performance of steps 452, 454, and 456 with the first interconnect test structure 402, then current from the current source 230 is conducted through the second interconnect test structure 404 until the second interconnect test structure 404 exhibits electromigration failure (step 460 of FIG. 10). Note that the level of current flowing through the second interconnect test structure 404 for causing electromigration failure is substantially same as the level of current used to flow through the first interconnect test structure 402 for causing electromigration failure therein, according to one embodiment of the present invention. The location of the void causing the electromigration failure within the second interconnect test structure 404 is then determined (step 462 of FIG. 10).

If the location of such a void is within the respective test line 216 or the respective via 224 of the second interconnect test structure 404 (step 464 of FIG. 10), then the second width, $w_{f2}$, of the second interconnect test structure 404 is determined to be the critical width of the feeder line that causes a transition of the location of the void from within the feeder line 208 into one of the test line 216 or the via 224 (step 466 of FIG. 10), and the assessment procedure of FIG. 10 ends. On the other hand, if the location of such a void is still within the respective feeder line 208 of the second interconnect test structure 404, then steps 460, 462, and 464 are repeated for the subsequent third interconnect test structure 406 with the respective feeder line 208 having the subsequently larger width, $w_{f3}$.

Such steps 460, 462, and 464 of FIG. 10 are repeated with the subsequent one of the plurality of interconnect test structures with the respective feeder line having the subsequently larger width until the location of the void causing the electromigration failure transitions from being within the feeder line to within one of the test line or the via. The width of the respective feeder line of such one of the plurality of interconnect test structures is determined to be the critical width.

The critical width is used to quantify the level of permeability of the diffusion barrier layer material 218 at the bottom of the via structure 224. The effect of the flux divergence of material for the feeder line 208 decreases as the width of the feeder line 208 increases. As the width of the feeder line 208 is further increased, eventually, the effect of the flux divergence of material for the feeder line 208 becomes negligible such that electromigration failure results from void formation within the test line 216. A higher level of permeability of the diffusion barrier layer material 218 at the bottom of the via structure 224 requires a larger width of the feeder line 208 before the effect of the flux divergence of material for the feeder line 208 becomes negligible.

Thus, the critical width when the location of the void causing the electromigration failure within the interconnect test structure 200 transitions from being within the feeder line to within one of the test line or the via indicates a level of permeability of the diffusion barrier layer material 218. A higher critical width indicates a higher level of permeability of the diffusion barrier layer material 218. In this manner, the plurality of the interconnect test structures 402, 404, 406, and 408 of FIG. 9 are used for determining the level of permeability of the diffusion barrier layer material 218. More numerous number of interconnect test structures may be used than the example of the four interconnect test structures 402, 404, 406, and 408 of FIG. 9. However, four interconnect test structures 402, 404, 406, and 408 are illustrated in FIG. 9 for clarity of illustration.

In this manner, the interconnect test structure 200 of the present invention determines whether or not the diffusion barrier layer material 218 within the interconnect is permeable. In addition, the level of permeability of the diffusion barrier layer material 218 is also determined with a plurality of such an interconnect test structure 200 with respective feeder lines having successively increasing widths. The permeability of the diffusion barrier layer material within an interconnect results in electromigration failure of the interconnect structure, especially as the barrier material becomes thinner when integrated circuit device dimensions are further scaled down. The interconnect test structure 200 of the present invention may advantageously be used for assessing such permeability for various thicknesses of the barrier layer material and for various types of the barrier layer material to design for minimized electromigration failure of interconnect structures having a diffusion barrier layer material.

The foregoing is by way of example only and is not intended to be limiting. Any specified material or any specified dimension of any structure described herein is by way of example only. For example, the present invention may advantageously be used for characterizing the level of permeability of any type of layer material, aside from the example of the diffusion barrier layer material, within an interconnect structure, as would be apparent to one of ordinary skill in the art of integrated circuit fabrication from the description herein. Furthermore, the present invention may be practiced with the cathode line 202, the feeder line 208, and the test line 216 of the interconnect test structure 200 being comprised of any type of conductive material, as would be apparent to one of ordinary skill in the art of integrated circuit fabrication from the description herein.

Figure 1:
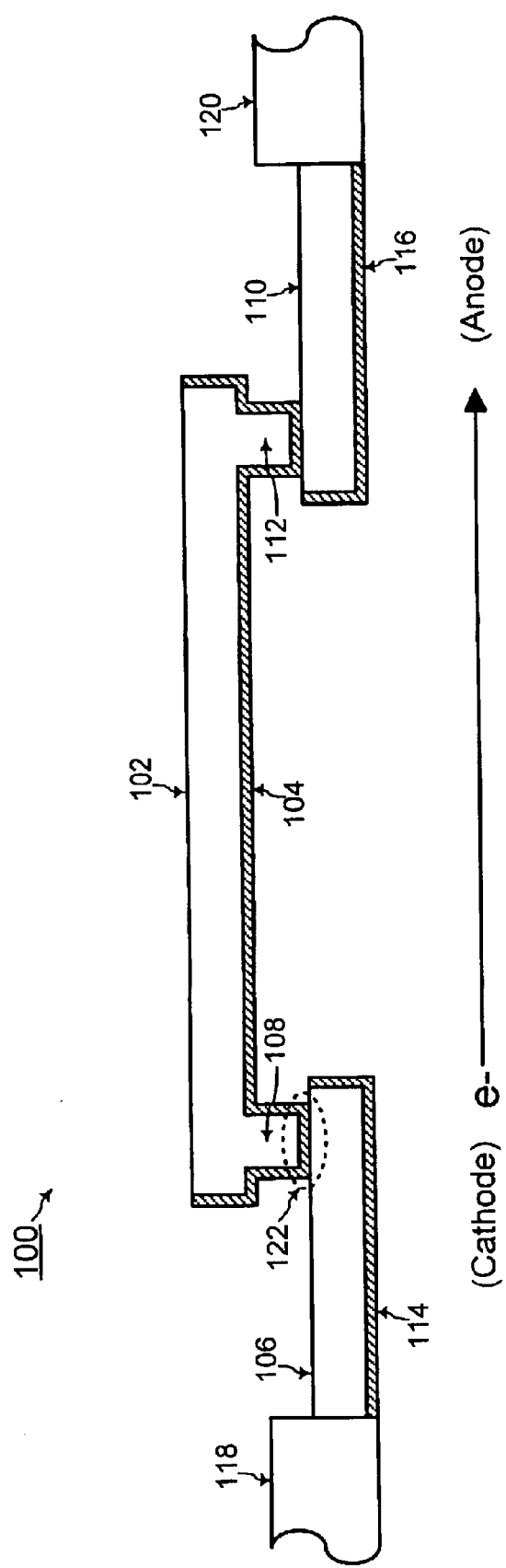
FIG. 1 shows a cross-sectional view of an interconnect test structure having a test line coupled to feeder lines with significantly larger widths such that permeability of a layer material within the interconnect test structure may not be detected, according to the prior art.
Figure 11:
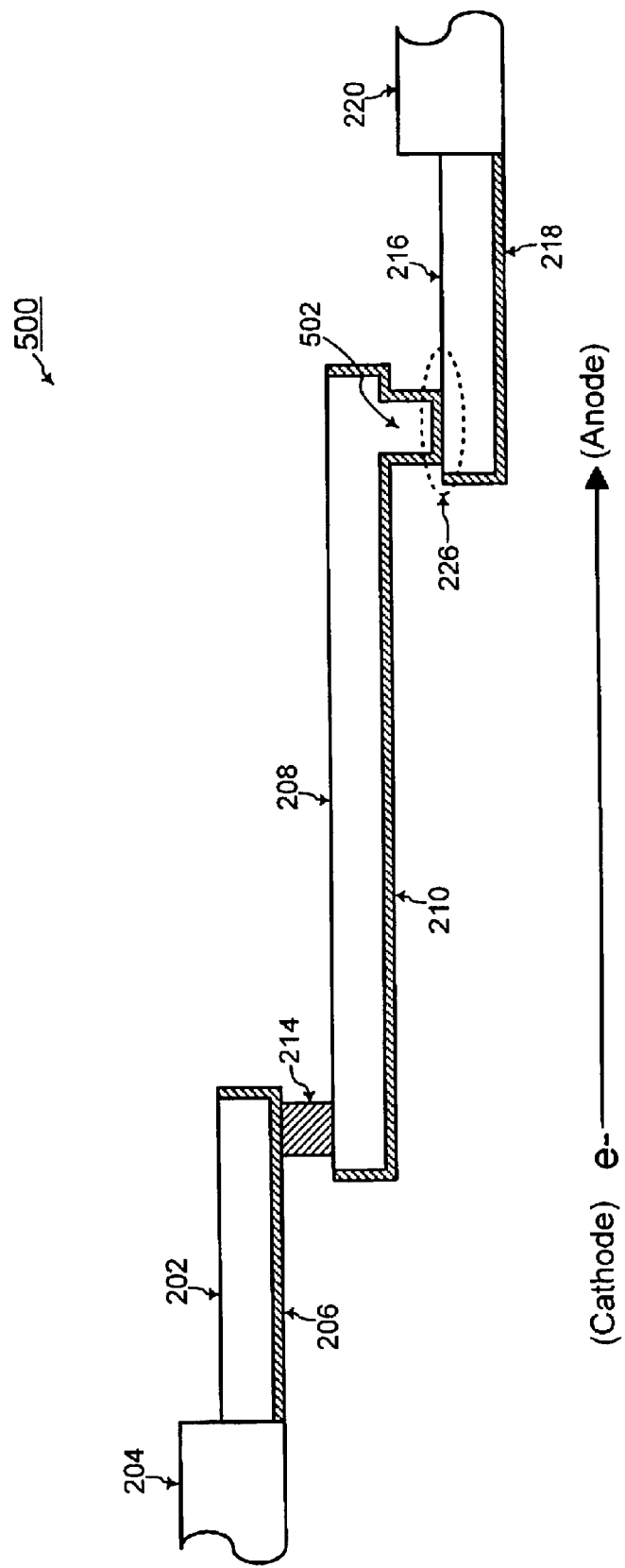
FIG. 11 shows a cross-sectional view of an interconnect test structure for assessing the permeability of a diffusion barrier layer material disposed at the bottom of a via that is part of a dual damascene structure for the feeder line, according to another embodiment of the present invention.

Additionally, the interconnect levels of the cathode line 202, the feeder line 208, and the test line 216 of the interconnect test structure 200 of FIG. 4 is by way of example only. For example, FIG. 11 illustrates an interconnect test structure 500 with interconnect levels for the cathode line 202, the feeder line 208, and the test line 216 that are different from FIG. 4. Elements having the same reference number in FIGS. 4 and 11 refer to elements having similar structure and function as already described herein with respect to FIG. 4. However, in FIG. 1, the cathode line 202 is at a higher interconnect level from the feeder line 208 that is at a higher interconnect level from the test line 216.

In that case, the no-flux structure 214 is still a via that is between the cathode line 202 and the feeder line 208. However, a portion of the diffusion barrier layer material 210 surrounding the feeder line 208 is at the at the interface 226 of interest between the test line 216 and the feeder line 208. Such a portion of the diffusion barrier layer material 210 is at the bottom of a via structure 502 that is formed as part of a dual damascene structure of the feeder line 208 in FIG. 11. The present invention may be practiced to assess the permeability of such a diffusion barrier layer material 210 at the bottom of the via structure 502 in FIG. 11, as would be apparent to one of ordinary skill in the art from the description herein.

Figure 12:
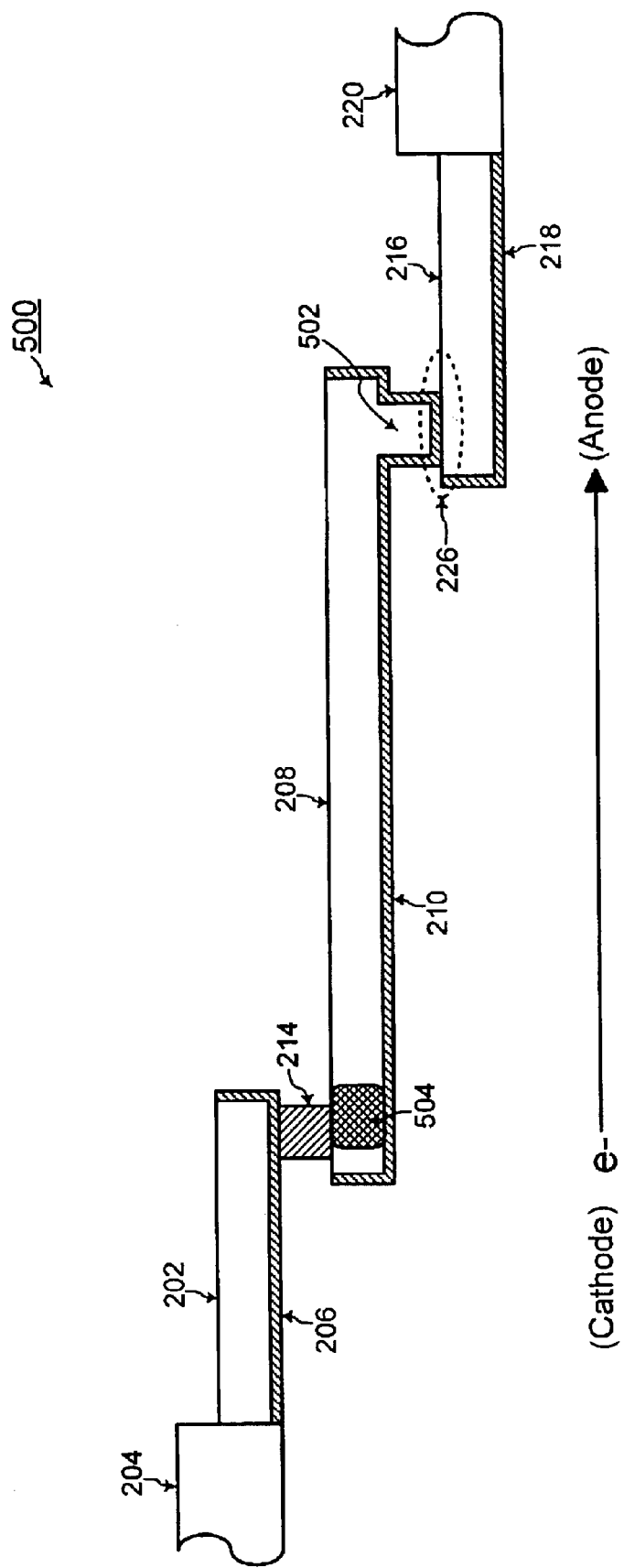
FIG. 12 shows the cross-sectional view of the interconnect test structure of FIG. 11 with formation of a void within the feeder line when the diffusion barrier layer material between the feeder line and the test line is permeable, according to an embodiment of the present invention.
Figure 13:
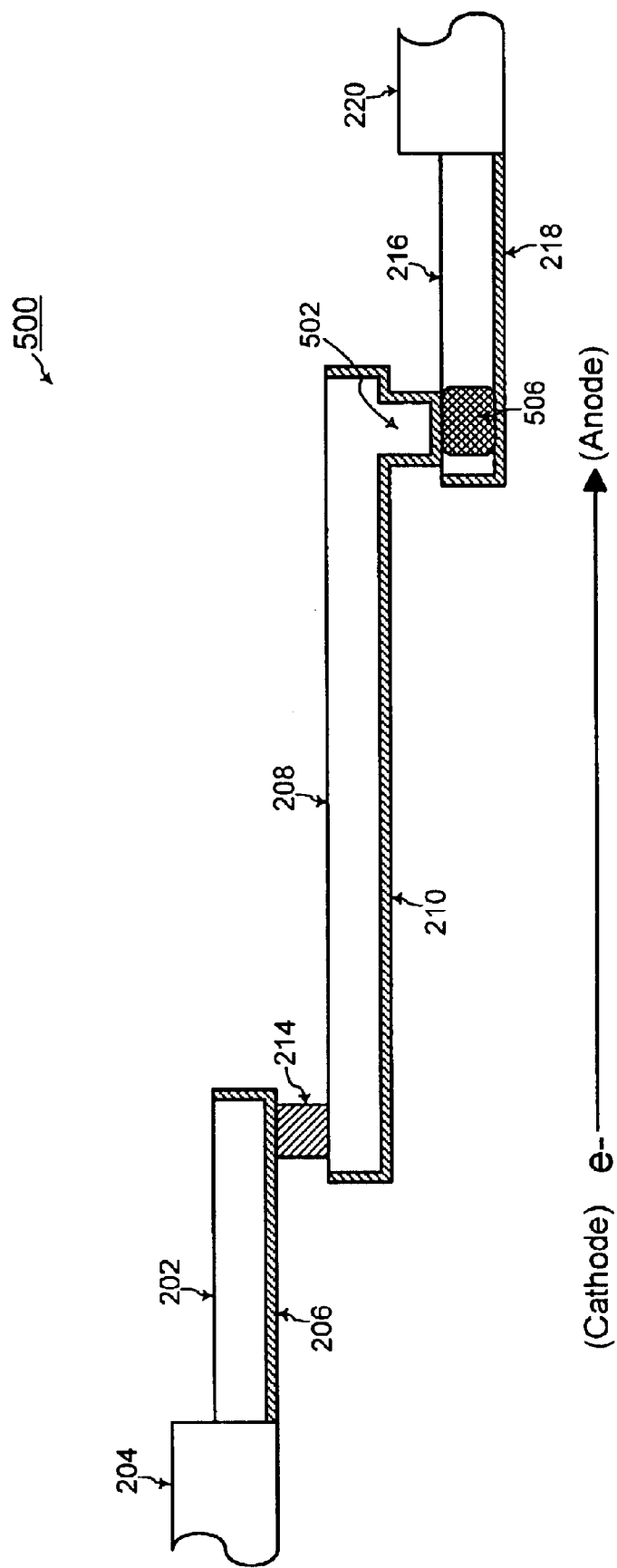
FIG. 13 shows the cross-sectional view of the interconnect test structure of FIG. 11 with formation of a void within the test line when the diffusion barrier layer material between the feeder line and the test line is impermeable, according to an embodiment of the present invention.

For example, referring to FIG. 12, a void 504 is formed within the feeder line 208 of the interconnect test structure 500 of FIG. 11 indicating that the diffusion barrier layer material 210 at the bottom of the via structure 502 is permeable. Alternatively, referring to FIG. 13, a void 506 is formed within the test line 216 of the interconnect test structure 500 of FIG. 11 indicating that the diffusion barrier layer material 210 at the bottom of the via structure 502 is impermeable.

Finally, as will be understood by those skilled in the art, the structures described herein may be made or used in the same way regardless of their position and orientation. Accordingly, it is to be understood that terms and phrases such as "on" as used herein refer to relative location and orientation of various portions of the structures with respect to one another, and are not intended to suggest that any particular absolute orientation with respect to external objects is necessary or required.

The present invention is limited only as defined in the following claims and equivalents thereof.

We claim:

1. An interconnect test structure for characterizing electromigration permeability, comprising:
    a test line, a feeder line, and a cathode line, with current flowing from the test line through the feeder line to the cathode line;
    a no-flux structure disposed between the cathode line and the feeder line; and
    a layer material disposed between the feeder line and the test line, wherein the layer material is abutted by material of the feeder line and material of the test line;
    and wherein a respective current density and length product of the feeder line and test line is respectively less than and greater than a respective critical Blech length constant.

2. The interconnect test structure of claim 1, wherein the layer material is disposed at a bottom of a via that is part of a dual damascene structure of the test line, and wherein an occurrence of a void within the via indicates that the layer material is impermeable.

3. The interconnect test structure of claim 1, wherein the layer material is disposed at a bottom of a via that is part of a dual damascene structure of the feeder line.

4. The interconnect test structure of claim 1, wherein the no-flux structure is a via comprised of a no-flux conductive material.

5. The interconnect test structure of claim 4, wherein the no-flux structure is comprised of tungsten.

6. The interconnect test structure of claim 1, wherein the layer material is a diffusion barrier layer material.

7. The interconnect test structure of claim 6, wherein the diffusion barrier layer material is disposed at a bottom of a via.

8. The interconnect test structure of claim 6, wherein the test line and the supply line are comprised of copper.

9. A system for characterizing electromigration permeability, comprising:
    an interconnect test structure including:
    a test line, a feeder line, and a cathode line, with current flowing from the test line through the feeder line to the cathode line;
    a no-flux structure disposed between the cathode line and the feeder line; and
    a layer material disposed between the feeder line and the test line, and wherein the layer material is abutted by material of the feeder line and material of the test line;
    wherein a respective current density and length product of the feeder line and test line is respectively less than and greater than a respective critical Blech length constant;
    a current source operable to conduct the current through the interconnect test structure; and
    a tool for determining a location of a void in the feeder line or the test line that with the location of the void indicating whether the layer material is permeable or impermeable.

10. The system of claim 9, further comprising:
    a plurality of the interconnect test structures, with successively increasing widths of respective feeder lines; and
    means for determining a critical width of a respective feeder line of one of the interconnect test structures when a respective void therein transitions from occurring within the feeder line to occurring within the test line;
    and wherein the critical width indicates a level of permeability of the layer material.

11. The system of claim 9, wherein the layer material is disposed at a bottom of a via that is part of a dual damascene structure of the test line, and wherein an occurrence of a void within the via indicates that the layer material is impermeable.

12. The system of claim 9, wherein the layer material is disposed at a bottom of a via that is part of a dual damascene structure of the feeder line.

13. The system of claim 9, wherein the no-flux structure is a via comprised of a no-flux conductive material.

14. The system of claim 13, wherein the no-flux structure is comprised of tungsten.

15. The system of claim 9, wherein the layer material is a diffusion barrier layer material.

16. The system of claim 15, wherein the diffusion barrier layer material is disposed at a bottom of a via.

17. The system of claim 15, wherein the test line and the supply line are comprised of copper.

18. A method for characterizing electromigration permeability of a layer material, including the steps of:
    conducting a current from a test line through a feeder line to a cathode line of an interconnect test structure;
    wherein a no-flux structure is disposed between the cathode line and the feeder line, and wherein the layer material is disposed between the feeder line and the test line;
    and wherein the layer material is abutted by material of the feeder line and material of the test line;
    and wherein a respective current density and length product of the feeder line and test line is respectively less than and greater than a respective critical Blech length constant; and
    determining a location of a void in the feeder line or the test line with the location of the void indicating whether the layer material is permeable or impermeable.

19. The method of claim 18, further including the steps of:

forming a plurality of the interconnect test structures, with successively increasing widths of respective feeder lines, used for determining a critical width of a respective feeder line of one of the interconnect test structures when a respective void therein transitions from occurring within the feeder line to occurring within the test line;

and wherein the critical width indicates a level of permeability of the layer material.

20. The method of claim 18, wherein the layer material is disposed at a bottom of a via that is part of a dual damascene structure of the test line, and wherein an occurrence of a void within the via indicates that the layer material is impermeable.

21. The method of claim 18, wherein the layer material is disposed at a bottom of a via that is part of a dual damascene structure of the feeder line.

22. The method of claim 18, wherein the no-flux structure is a via comprised of a no-flux conductive material.

23. The method of claim 22, wherein the no-flux structure is comprised of tungsten.

24. The method of claim 18, wherein the layer material is a diffusion barrier layer material.

25. The method of claim 24, wherein the diffusion barrier layer material is disposed at a bottom of a via.

26. The method of claim 24, wherein the test line and the feeder line are comprised of copper.

* * * * *